United States Patent
Miyairi

(10) Patent No.: US 9,991,228 B2
(45) Date of Patent: Jun. 5, 2018

(54) SEMICONDUCTOR DEVICE WITH ELECTROMAGNETIC SHIELD

(71) Applicant: SHINKO ELECTRIC INDUSTRIES CO., LTD., Nagano-Shi, Nagano-Ken (JP)

(72) Inventor: Ken Miyairi, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days. days.

(21) Appl. No.: 15/587,834

(22) Filed: May 5, 2017

(65) Prior Publication Data
US 2017/0345793 A1    Nov. 30, 2017

(30) Foreign Application Priority Data

May 26, 2016 (JP) .................................. 2016-105603

(51) Int. Cl.
| | |
|---|---|
| H01L 23/552 | (2006.01) |
| H01L 25/065 | (2006.01) |
| H01L 23/00 | (2006.01) |
| H01L 25/00 | (2006.01) |
| H01L 23/522 | (2006.01) |
| H01L 23/538 | (2006.01) |

(52) U.S. Cl.
CPC ...... *H01L 25/0655* (2013.01); *H01L 23/5225* (2013.01); *H01L 23/5383* (2013.01); *H01L 23/552* (2013.01); *H01L 24/02* (2013.01); *H01L 24/96* (2013.01); *H01L 25/50* (2013.01); *H01L 2224/02311* (2013.01); *H01L 2224/02331* (2013.01); *H01L 2224/02379* (2013.01); *H01L 2224/02381* (2013.01); *H01L 2224/95001* (2013.01)

(58) Field of Classification Search
None
See application file for complete search history.

(56) References Cited

U.S. PATENT DOCUMENTS 7,643,311 B2 * 1/2010 Coffy .................... H01L 21/561
                                                                    174/350
9,520,387 B2 * 12/2016 Kim ........................ H01L 25/16
(Continued)

FOREIGN PATENT DOCUMENTS

JP    2006-173493 A    6/2006

*Primary Examiner* — Andres Munoz
(74) *Attorney, Agent, or Firm* — Tarolli, Sundheim, Covell & Tummino LLP

(57) ABSTRACT

A semiconductor device includes an electronic component and a wiring structural body located below the electronic component. The wiring structural body includes an insulation layer and a wiring layer that is connected to an electrode terminal of the electronic component. The semiconductor device also includes a wiring shield body arranged on a side surface of the wiring structural body, an encapsulation resin covering an upper surface of the wiring structural body and a side surface of the electronic component, and a component shield body covering a surface of the encapsulation resin and continuously covering an upper surface side of the electronic component. The wiring shield body is connected to the component shield body. The wiring shield body includes an exposed side surface that is coplanar with a side surface of the component shield body.

11 Claims, 10 Drawing Sheets

(56) References Cited

U.S. PATENT DOCUMENTS

| | | | |
|---|---|---|---|
| 2006/0067070 A1* | 3/2006 | Otsuki | H01L 23/5387 361/816 |
| 2007/0145539 A1* | 6/2007 | Lam | H01L 21/561 257/659 |
| 2008/0210462 A1* | 9/2008 | Kawagishi | H01L 21/561 174/377 |
| 2012/0217624 A1* | 8/2012 | Morris | H01L 23/49827 257/659 |
| 2012/0300412 A1* | 11/2012 | Song | H01L 23/552 361/728 |
| 2014/0048913 A1* | 2/2014 | Park | H01L 23/552 257/659 |
| 2016/0351509 A1* | 12/2016 | Dang | H01L 23/552 |
| 2017/0110412 A1* | 4/2017 | Wang | H01L 21/78 |

* cited by examiner

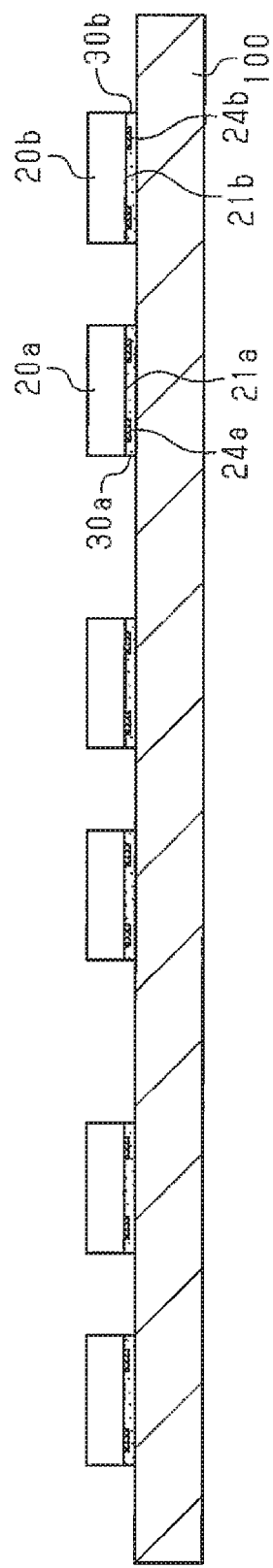
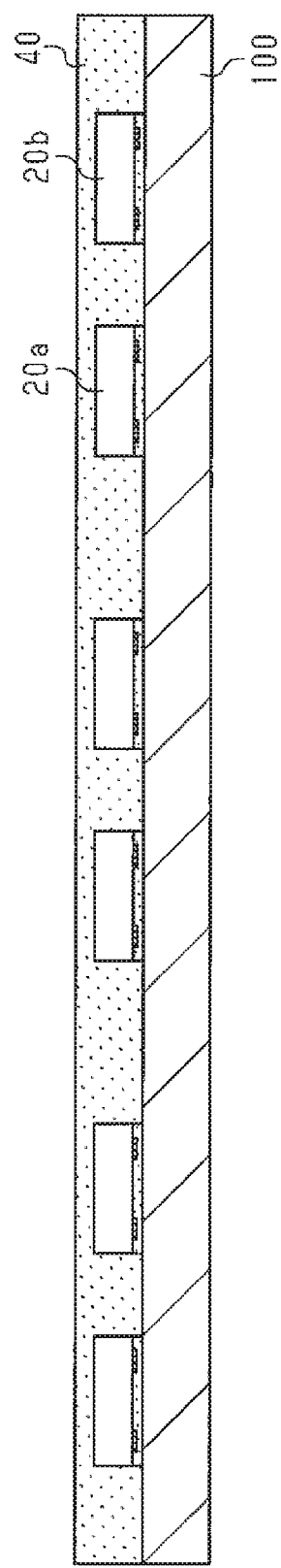

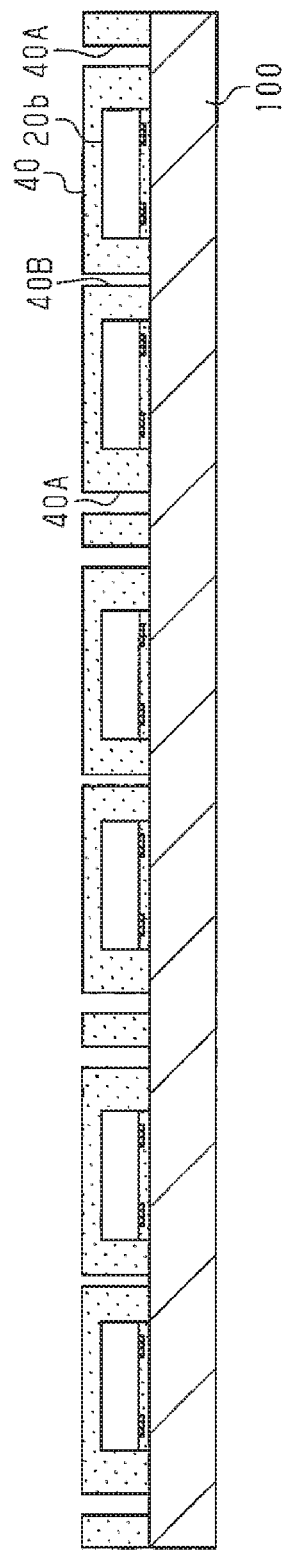
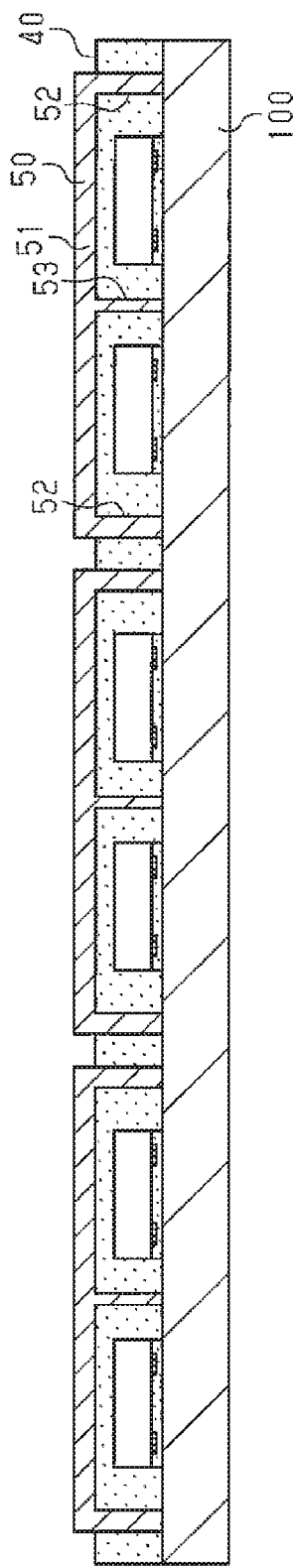

SEMICONDUCTOR DEVICE WITH ELECTROMAGNETIC SHIELD

CROSS-REFERENCE TO RELATED APPLICATIONS

This application is based upon and claims the benefit of priority from prior Japanese Patent Application No. 2016-105603, filed on May 26, 2016, the entire contents of which are incorporated herein by reference.

FIELD

This disclosure relates to a semiconductor device and a method for manufacturing a semiconductor device.

BACKGROUND

A semiconductor device known in the art includes a wiring substrate and electronic components mounted on the wiring substrate. Each electronic component emits electromagnetic waves in accordance with its operation. Also, the electronic component may be affected by electromagnetic waves received from the exterior. In this regard, some semiconductor devices may include a shield case that prevents emission of electromagnetic waves from the electronic components mounted on the wiring substrate and entrance of electromagnetic waves into the electronic components. Japanese laid-open patent publication No. 2006-173493 describes one example of a semiconductor device that includes a shield case.

SUMMARY

It is desirable that a semiconductor device that includes a plurality of electronic components and a shield, which limits effects of electromagnetic waves, to be reduced in size.

One embodiment is a semiconductor device. The semiconductor device includes an electronic component, a wiring structural body, a wiring shield body, an encapsulation resin, and a component shield body. The electronic component includes a lower surface on which an electrode terminal is arranged. The wiring structural body is located below the electronic component. The wiring structural body includes an insulation layer and a wiring layer that is connected to the electrode terminal. The wiring shield body is arranged on a side surface of the wiring structural body. The encapsulation resin covers an upper surface of the wiring structural body and a side surface of the electronic component. The component shield body covers a surface of the encapsulation resin and continuously covers an upper surface side of the electronic component. The wiring shield body is connected to the component shield body. The wiring shield body includes a side surface that is exposed to the exterior and coplanar with a side surface of the component shield body.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 6A, 6B, 7A, and 7B are schematic cross-sectional views illustrating another method for manufacturing a semiconductor device;

DESCRIPTION OF THE EMBODIMENTS

Figure 1A:
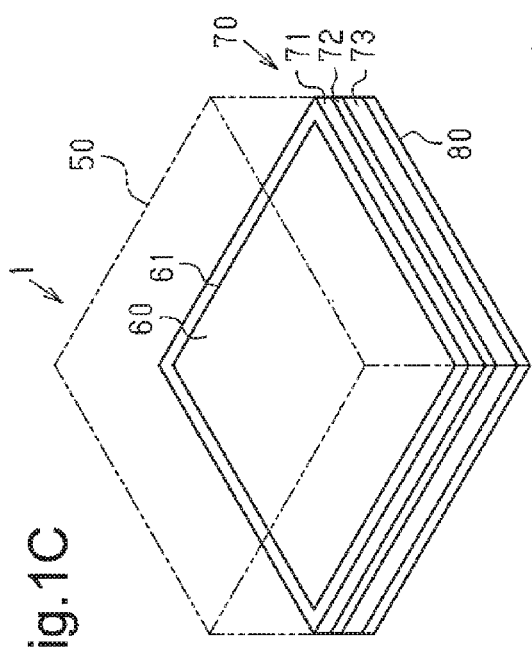
FIG. 1A is a schematic perspective view illustrating one embodiment of a semiconductor device.

Embodiments will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings.

Figure 1B:
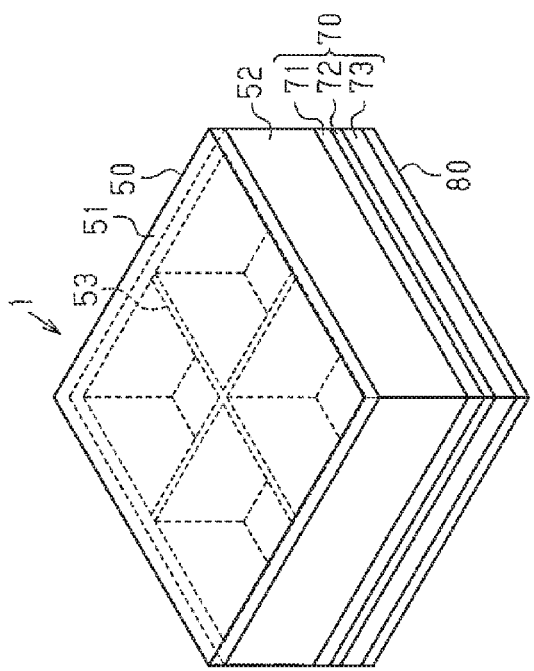
FIG. 1B is a schematic cross-sectional view of the semiconductor device illustrated in FIG. 1A.
Figure 1C:
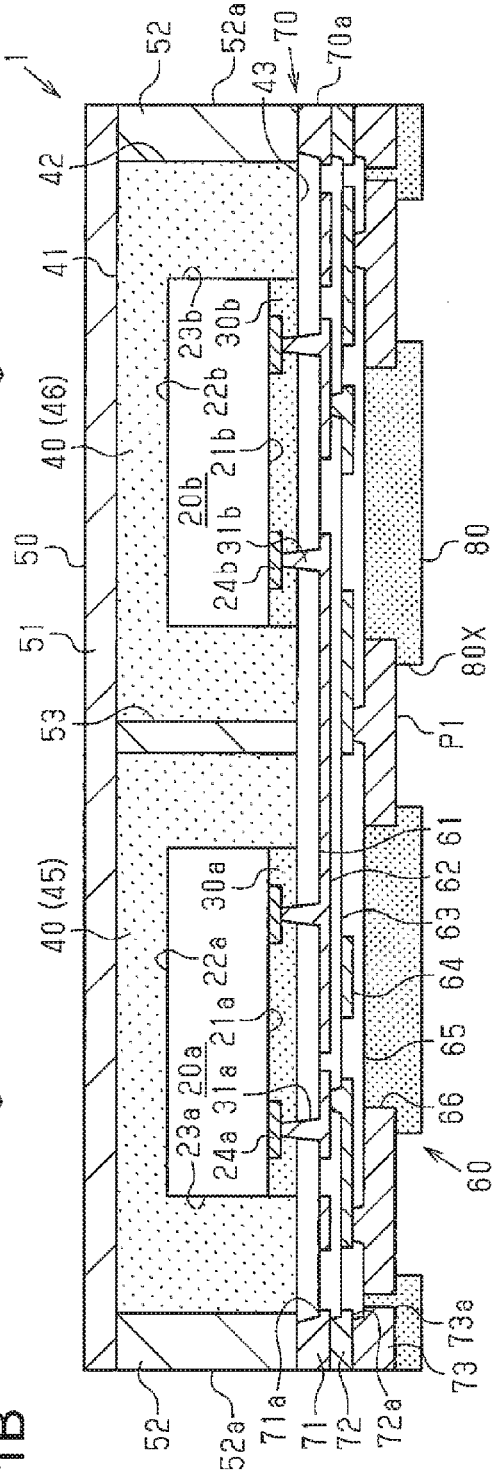
FIG. 1C is a schematic perspective view of a wiring structural body illustrated in FIG. 1B.

One embodiment will now be described with reference to FIGS. 1A to 5C. FIG. 1A is a perspective view of a semiconductor device 1. FIG. 1B is a schematic cross-sectional view of the semiconductor device 1.

The semiconductor device 1 is substantially rectangular. The semiconductor device 1 includes semiconductor components 20a, 20b, an encapsulation resin 40, a component shield body 50, a wiring structural body 60, a wiring shield body 70, and a solder resist layer 80.

The semiconductor components 20a, 20b each have an electrical function of the semiconductor device 1. The semiconductor components 20a, 20b are located in the semiconductor device 1. The semiconductor components 20a, 20b are each formed by a thin semiconductor substrate formed from, for example, silicon (Si). The semiconductor components 20a, 20b each include a semiconductor integrated circuit that provides various kinds of functions. In the present embodiment, the semiconductor components 20a, 20b respectively include lower surfaces 21a, 21b, on which the semiconductor integrated circuits are formed. The lower surfaces 21a, 21b each function as a circuit formation surface. The lower surfaces 21a, 21b respectively include electrode terminals 24a, 24b that connect the semiconductor integrated circuits to the exterior of the semiconductor components 20a, 20b. The material of the electrode terminals 24a, 24b may be, for example, copper or a copper alloy.

The semiconductor components 20a, 20b may be, for example, a logic chip such as a central processing unit (CPU) chip or a graphics processing unit (GPU) chip. Alternatively, the semiconductor components 20a, 20b may be a memory chip such as a dynamic random access memory (DRAM) chip, a static random access memory (SRAM) chip, or a flash memory chip. In FIG. 1B, the semiconductor components 20a, 20b are illustrated as the electronic components. However, the semiconductor device 1 may include other semiconductor components or discrete electronic components (e.g., transistor, diode, and resistor) as the electronic components.

The lower surface 21a of the semiconductor component 20a and the electrode terminals 24a are covered by an adhesive agent 30a. The adhesive agent 30a includes via holes 31a that partially expose lower surfaces of the electrode terminals 24a. In the same manner, the lower surface 21b of the semiconductor component 20b and the electrode terminals 24b are covered by an adhesive agent 30b. The adhesive agent 30b includes via holes 31b that partially expose lower surfaces of the electrode terminals 24b. The adhesive agent 30a and the adhesive agent 30b may each be, for example, an epoxy-type adhesive agent.

The semiconductor components 20a, 20b respectively include upper surfaces 22a, 22b and side surfaces 23a, 23b, which are covered by the encapsulation resin 40. The encapsulation resin 40 also covers side surfaces of the adhesive agent 30a and the adhesive agent 30b. The encapsulation resin 40 includes a flat lower surface 43. The material of the encapsulation resin 40 may be, for example, an epoxy-type thermosetting insulative resin. However, the insulative resin is not limited to a thermosetting insulative resin and may be a photosensitive insulative resin.

The encapsulation resin 40 is covered by the component shield body 50. The component shield body 50 includes a first component shield portion 51 and a second component shield portion 52. The first component shield portion 51 is one example of a first shield portion. The second component shield portion 52 is one example of a second shield portion. The encapsulation resin 40 includes an upper surface 41, which is in contact with the first component shield portion 51. The first component shield portion 51 covers the entire upper surface 41. The encapsulation resin 40 also includes side surfaces 42, which are in contact with the second component shield portion 52. The second component shield portion 52 covers the entire side surfaces 42. The first component shield portion 51 and the second component shield portion 52 are formed from a metal and connected to each other.

The component shield body 50 also includes a third component shield portion 53 that is located between the semiconductor components 20a, 20b. The third component shield portion 53 is plate-shaped and extends from the first component shield portion 51 to the wiring structural body 60. In the present embodiment, the third component shield portion 53 shields the first semiconductor component 20a from electromagnetic waves emitted by the second semiconductor component 20b and also shields the second semiconductor component 20b from electromagnetic waves emitted by the first semiconductor component 20a. That is, the third component shield portion 53 electromagnetically separates the first semiconductor component 20a and the second semiconductor component 20b. In the present embodiment, the third component shield portion 53 divides the encapsulation resin 40 into four encapsulation portions. The four encapsulation portions include a first encapsulation portion 45, which covers the first semiconductor component 20a, and a second encapsulation portion 46, which covers the second semiconductor component 20b. Although not illustrated in the drawings, the remaining two of the four encapsulation portions also cover other electronic components, such as semiconductor components or discrete electronic components. The material of the component shield body 50 may be a highly conductive metal or a metal having a high initial magnetic permeability, such as copper, a copper alloy, nickel (Ni), or a nickel alloy.

The wiring structural body 60 is arranged on the lower surface 43 of the encapsulation resin 40. The wiring structural body 60 includes an insulation layer 61, a wiring layer 62, an insulation layer 63, a wiring layer 64, an insulation layer 65, and a wiring layer 66. The insulation layer 61, the wiring layer 62, the insulation layer 63, the wiring layer 64, the insulation layer 65, and the wiring layer 66 are downwardly stacked from the lower surface 43 of the encapsulation resin 40 in this order.

The insulation layer 61 covers the lower surface 43 of the encapsulation resin 40, the adhesive agent 30a, and the adhesive agent 30b. The wiring layer 62 includes wiring patterns and via wirings. The wiring patterns are arranged on a lower surface of the insulation layer 61. The via wirings are formed in the via holes 31a, 31b of the adhesive agent 30a and the adhesive agent 30b, which extend through the insulation layer 61, and connected to the electrode terminals 24a, 24b. The insulation layer 63 is arranged on the lower surface of the insulation layer 61 to cover the wiring layer 62. The wiring layer 64 is arranged on a lower surface of the insulation layer 63. The wiring layer 64 includes via wirings, which extend through the insulation layer 63 in the thickness-wise direction, and wiring patterns, which are connected by the via wirings to the wiring layer 62 and arranged on the lower surface of the insulation layer 63. The insulation layer 65 is arranged on the lower surface of the insulation layer 63 to cover the wiring layer 64. The wiring layer 66 is arranged on a lower surface of the insulation layer 65. The wiring layer 66 includes via wirings, which extend through the insulation layer 65 in the thickness-wise direction, and wiring patterns, which are connected by the via wirings to the wiring layer 64 and arranged on the lower surface of the insulation layer 65.

The material of the wiring layers 62, 64, 66 may be, for example, copper (Cu) or a copper alloy. The material of the insulation layers 61, 63, 65 may be, for example, an insulative resin, such as an epoxy resin or a polyimide resin, or a resin material in which filler such as silica or alumina is mixed into such an insulative resin. Alternatively, the material of the insulation layers 61, 63, 65 may be a reinforcement material-containing insulative resin that is obtained, for example, by impregnating a reinforcement material of a woven cloth or a non-woven cloth of glass fibers, aramid fibers, or liquid crystal polymer (LCP) fibers, with a thermosetting resin that contains an epoxy resin or a polyimide resin as the main component. Alternatively, the material of the insulation layers 61, 63, 65 may be a thermosetting insulative resin or a photosensitive insulative resin.

The wiring structural body 60 is surrounded by the wiring shield body 70. That is, the wiring shield body 70 is arranged on side surfaces of the wiring structural body 60. As illustrated in 1C, the wiring shield body 70 is frame-shaped. FIG. 1A does not illustrate the encapsulation resin 40 and the semiconductor components 20a, 20b. Also, FIG. 1C does not illustrate members other than the insulation layer 61 of the wiring structural body 60, the wiring shield body 70, and the solder resist layer 80.

As illustrated in 1B, the wiring shield body 70 is arranged on the periphery of the insulation layers 61, 63, 65 of the wiring structural body 60 to cover and contact the insulation layers 61, 63, 65. The wiring shield body 70 is formed from a metal. The wiring shield body 70 is connected to the component shield body 50 (in present example, second component shield portion 52). The wiring shield body 70 includes side surfaces 70a. The second component shield portion 52 of the component shield body 50 includes side surfaces 52a, which are flush with the corresponding side surfaces 70a of the wiring shield body 70. The material of the wiring shield body 70 may be copper or a copper alloy.

In the present embodiment, the wiring shield body 70 includes three metal members 71, 72, 73, which are stacked in the stacking direction of the wiring structural body 60. Each of the three metal members 71, 72, 73 is rectangular frame-shaped. The first metal member 71 is connected to the second component shield portion 52 of the component shield body 50. The first metal member 71 covers side surfaces of the insulation layer 61. The first metal member 71 includes a flange 71a, which extends on the lower surface of the insulation layer 61. The first metal member 71 includes a lower surface, which is connected to the second metal member 72. The second metal member 72 covers side surfaces of the insulation layer 63. The second metal member 72 includes a flange 72a, which extends on the lower surface of the insulation layer 63. The second metal member 72 includes a lower surface, which is connected to the third metal member 73. The third metal member 73 covers side surfaces of the insulation layer 65. The third metal member 73 includes a flange 73a, which extends on the lower surface of the insulation layer 65. The wiring shield body 70, which includes the first to third metal members 71 to 73 stacked in this manner, includes inner walls having irregularities formed by the flanges 71a to 73a. Such irregularities increase the adhesiveness of the wiring shield body 70 and the wiring structural body 60 (insulation layers 61, 63, 65).

The solder resist layer 80 is arranged on the lower surface of the insulation layer 65 to cover a portion of the wiring layer 66 and the wiring shield body 70. The solder resist layer 80 includes openings 80X, which partially expose a lower surface of the wiring layer 66 as external connection terminals P1. Although not illustrated in the drawings, bumps (e.g., solder bumps) are arranged on the external connection terminals P1. The bumps are used to mount the semiconductor device 1 on a board or the like (not illustrated).

The solder resist layer 80 may be, for example, a photosensitive dry film resist or a liquid photoresist. The material of the solder resist layer 80 may be, for example, a novolac-type resin or an acrylic resin. For example, when a photosensitive dry film resist is used, the insulation layer 65, the wiring layer 66, and the wiring shield body 70 are laminated with the dry film through thermocompression. The dry film is patterned through photolithography to obtain the solder resist layer 80 including the openings 80X. When a liquid photoresist is used, the solder resist layer 80 is also obtained through the same steps.

The operation of the semiconductor device 1 will now be described.

In the semiconductor device 1, the component shield body 50 covers the upper surface 41 and the side surfaces 42 of the encapsulation resin 40, which covers the semiconductor components 20a, 20b. The wiring structural body 60 of the semiconductor device 1 includes the wiring layers 62, 64, 66 and the insulation layers 61, 63, 65. The wiring layers 62, 64, 66 are connected to the semiconductor components 20a, 20b. Additionally, the insulation layers 61, 63, 65 of the wiring structural body 60 are covered by the frame-shaped wiring shield body 70. The wiring shield body 70 is connected to the component shield body 50.

The side surfaces 70a of the wiring shield body 70 are exposed to the exterior. The side surfaces 70a are coplanar with the corresponding side surfaces 52a of the component shield body 50. That is, the side surfaces 70a, 52a are flush with each other. This reduces the size of the semiconductor device 1 as compared to a conventional semiconductor device including a shield case. Additionally, the first component shield portion 51 of the component shield body 50 is in contact with the upper surface 41 of the encapsulation resin 40 to cover the encapsulation resin 40. The encapsulation resin 40 only needs to cover the electronic components including the semiconductor components 20a, 20b in the semiconductor device 1. This reduces the thickness of the semiconductor device 1.

The component shield body 50 and the wiring shield body 70 cover the upper surface and side surfaces of the semiconductor device 1. More specifically, the semiconductor device 1 includes shields (component shield body 50 and wiring shield body 70) that cover the semiconductor components 20a, 20b and the wiring layers 62, 64, 66 to shield out electromagnetic waves. The shields shield the semiconductor components 20a, 20b and the wiring layers 62, 64, 66 from electromagnetic waves that are present outside the semiconductor device 1. Thus, the shields limit effects of electromagnetic waves on the semiconductor components 20a, 20b and the wiring layers 62, 64, 66. The shields also limit emission of electromagnetic waves from the semiconductor device 1 to the exterior.

The component shield body 50 includes the third component shield portion 53. The third component shield portion 53 is located between the semiconductor component 20a and the semiconductor component 20b. Thus, the third component shield portion 53 limits effects of electromagnetic waves between the semiconductor component 20a and the semiconductor component 20b.

The wiring shield body 70 includes the irregular inner walls. The irregularities limit separation of the wiring shield body 70 from the wiring structural body 60 and prevent separation of the wiring structural body 60 from the component shield body 50 connected to the wiring shield body 70.

A method for manufacturing the semiconductor device 1 will now be described. In the description, reference characters are given to elements as necessary. Reference characters may not be given to elements that are not described. For the sake of brevity, portions that ultimately become elements of the electronic device are indicated by reference characters used to denote the final elements.

First Manufacturing Method

A first method for manufacturing the semiconductor device 1 will now be described.

Figure 2A:
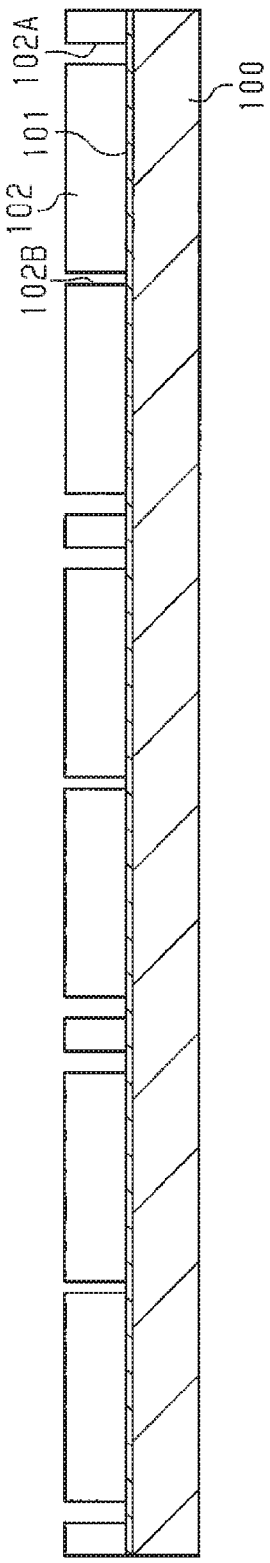
FIGS. 2A to 2C, 3A to 3C, 4A to 4C, and 5A to 5C are schematic cross-sectional views illustrating a method for manufacturing the semiconductor device illustrated in FIG. 1A.

As illustrated in FIG. 2A, a seed layer 101 is formed on the upper surface of a flat support body 100. The material of the support body 100 may be, for example, a highly rigid plate-shaped material such as silicon, glass, or metal (e.g., copper). The material of the seed layer 101 may be, for example, copper or a copper alloy. The seed layer 101 may be formed, for example, through sputtering or electroless plating.

A resist film 102 including openings 102A, 102B, which are arranged in given positions, is formed on the upper surface of the seed layer 101. The openings 102A, 102B are formed in conformance with the shape of the component shield body 50 illustrated in FIGS. 1A to 1C. In the present example, the openings 102A are formed in the positions corresponding to the second component shield portion 52 of the component shield body 50. The openings 102B are formed in the positions corresponding to the third component shield portion 53.

The material of the resist film 102 may be, for example, a material that resists electrolytic plating or etching. For example, a photosensitive dry film resist or a liquid photoresist may be used as the resist film 102. The material of the resist film 102 may be, for example, a novolac-type resin or an acrylic resin. For example, a dry film resist is patterned through photolithography to form the resist film 102 including the openings 102A, 102B.

Figure 2B:
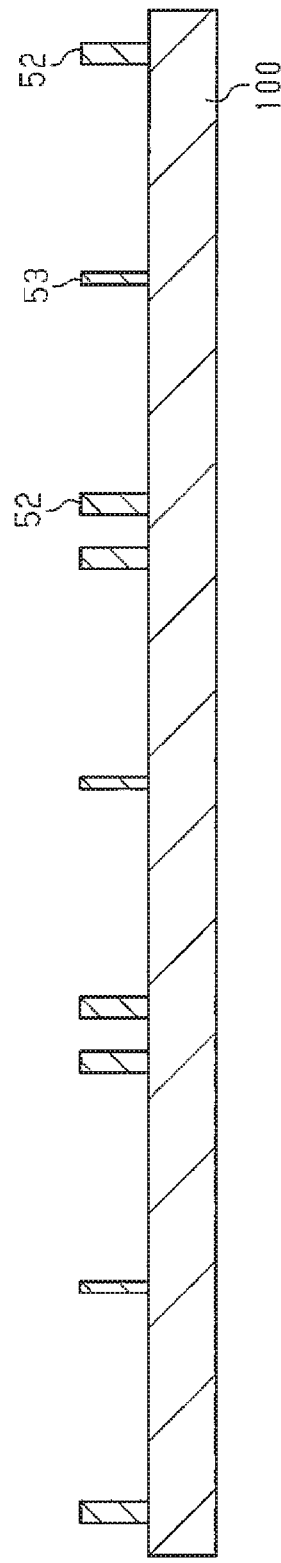

Then, electrolytic plating (e.g., electrolytic copper plating) in which the seed layer 101 is used as a plating power feeding layer is performed to form a plating layer (metal layer) in the openings 102A, 102B. The resist film 102 is removed, for example, by an alkaline defoliation liquid. The unnecessary seed layer 101, that is, the seed layer 101 exposed by the removal of the resist film 102, is removed through etching (e.g., wet etching). Consequently, as illustrated in FIG. 2B, the second and third component shield portions 52, 53 are formed upright on the upper surface of the support body 100.

Figure 2C:
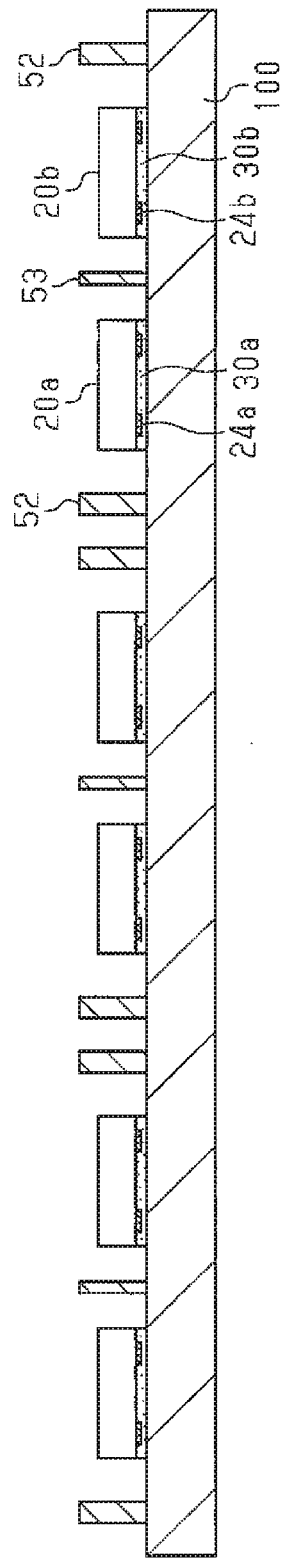

As illustrated in FIG. 2C, the semiconductor components 20a, 20b are arranged on the upper surface of the support body 100 with the adhesive agent 30a and the adhesive agent 30b applied in between. The adhesive agent 30a and the adhesive agent 30b are applied, for example, to the lower surfaces 21a, 21b of the semiconductor components 20a, 20b. Then, the semiconductor components 20a, 20b are arranged on the upper surface of the support body 100. The semiconductor components 20a, 20b adhere to the upper surface of the support body 100 in a face-down state in which the lower surfaces 21a, 21b including the electrode terminals 24a, 24b are located at the lower side.

Figure 3A:
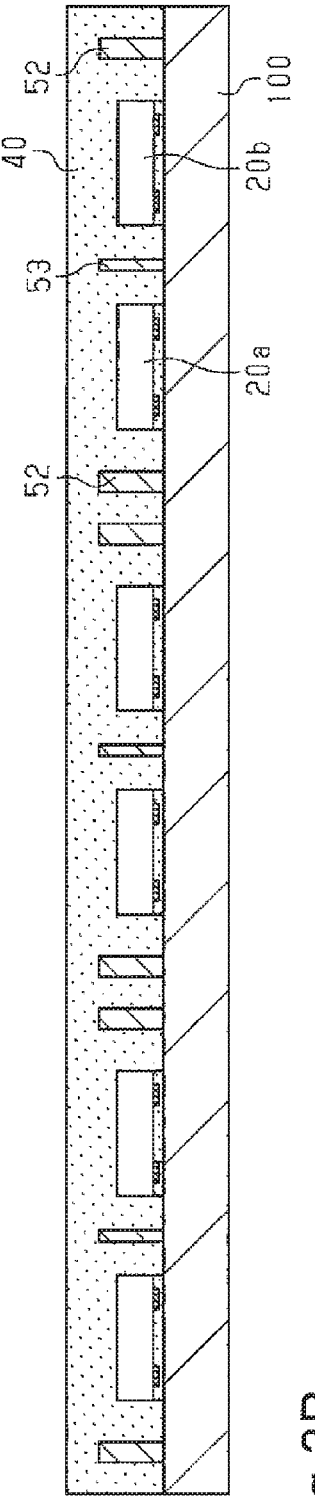

As illustrated in FIG. 3A, the encapsulation resin 40 are formed on the upper surface of the support body 100 to cover the semiconductor components 20a, 20b, the second component shield portion 52, and the third component shield portion 53.

Figure 3B:
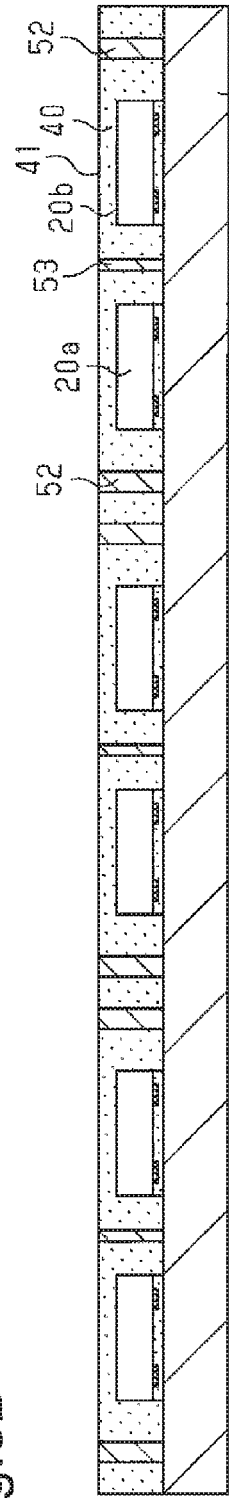

As illustrated in FIG. 3B, the encapsulation resin 40 is thinned to expose an upper end of the second component shield portion 52 and an upper end of the third component shield portion 53. The encapsulation resin 40 may be thinned, for example, through a chemical mechanical polishing (CMP) process. The thinning step smooths the upper surface 41 of the encapsulation resin 40.

Figure 3C:
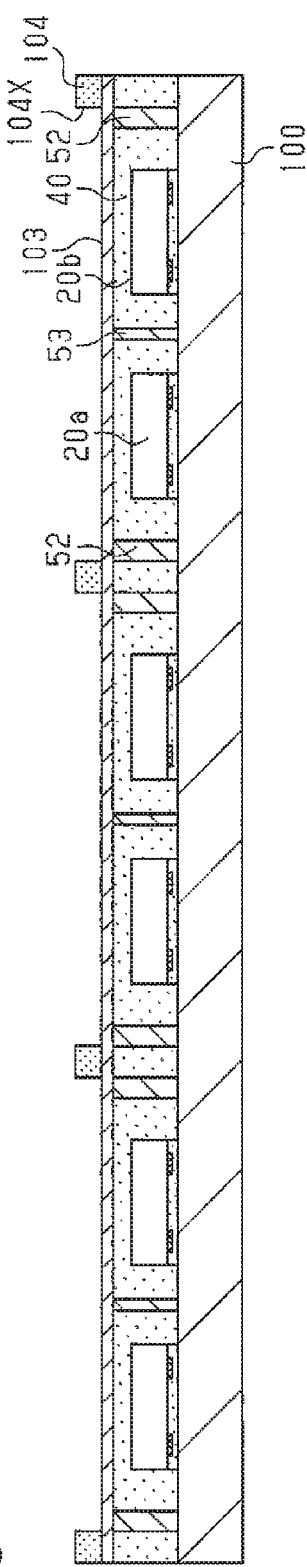

As illustrated in FIG. 3C, a seed layer 103 is formed on the upper surface 41 of the encapsulation resin 40. The material of the seed layer 103 may be, for example, copper or a copper alloy. The seed layer 103 may be formed, for example, through sputtering or electroless plating.

A resist film 104 including openings 104X, which are arranged in given positions, is formed on the upper surface of the seed layer 103. The openings 104X are formed in conformance with the shape of the component shield body 50 illustrated in FIGS. 1A to 1C. In the present example, the openings 104X are formed in the positions corresponding to the first component shield portion 51 of the component shield body 50.

The material of the resist film 104 may be, for example, a material that resists electrolytic plating or etching. For example, a photosensitive dry film resist or a liquid photoresist may be used as the resist film 104. The material of the resist film 104 may be, for example, a novolac-type resin or an acrylic resin. For example, a dry film resist is patterned through photolithography to form the resist film 104 including the openings 104X.

Figure 4A:
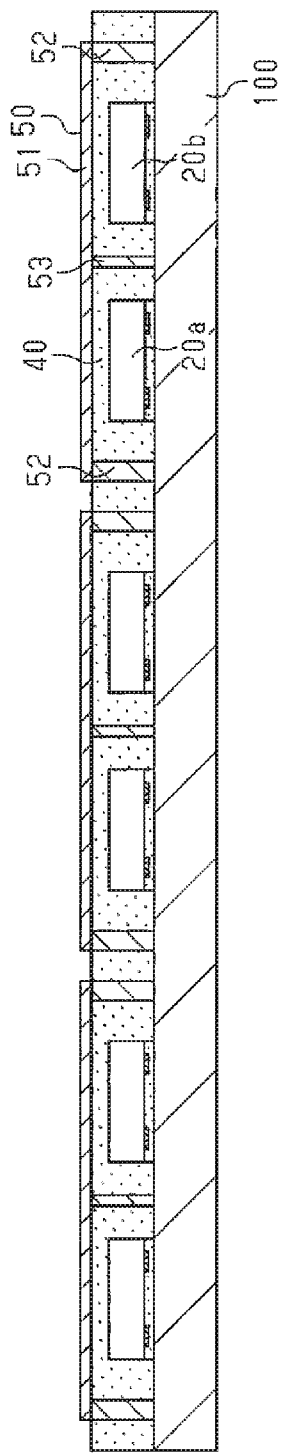

Then, electrolytic plating (e.g., electrolytic copper plating) in which the seed layer 103 is used as a plating power feeding layer is performed to form a plating layer (metal layer) in the openings 104X. The resist film 104 is removed, for example, by an alkaline defoliation liquid. The unnecessary seed layer 103 is removed through etching (e.g., wet etching). Consequently, as illustrated in FIG. 4A, the plating layer (metal layer) is formed as the first component shield portion 51, which covers the upper surface 41 of the encapsulation resin 40. The first component shield portion 51 is connected to the second component shield portion 52 and the third component shield portion 53. This obtains the component shield body 50 including the first to third component shield portions 51 to 53.

Figure 4B:
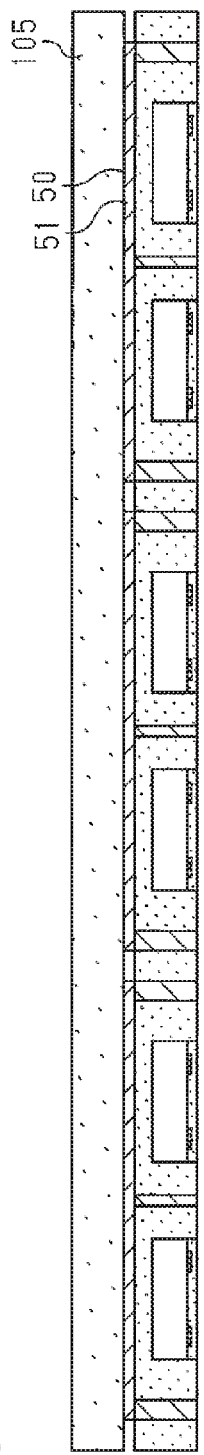

As illustrated in FIG. 4B, a protective layer 105 is formed to cover the first component shield portion 51, and the support body 100 (refer to FIG. 4A) is removed. The material of the protective layer 105 may be, for example, a material that resists plating or etching that will be described later. For example, a photosensitive dry film resist (e.g., novolac-type resin or acrylic resin) may be used as the material of the protective layer 105. Alternatively, the upper surface of the first component shield portion 51 may be laminated with a dry film through thermocompression to form the protective layer 105.

Figure 4C:
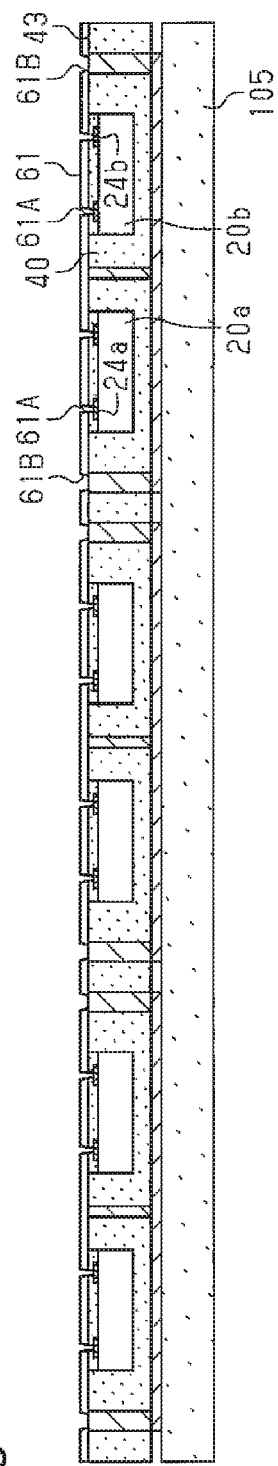

As illustrated in FIG. 4C, the insulation layer 61 is formed to cover the lower surface 43 (upper surface in FIG. 4C) of the encapsulation resin 40. FIG. 4C illustrates the structure of FIG. 4B that is inverted upside down. Via holes 61A are formed in the insulation layer 61, the adhesive agent 30a, and the adhesive agent 30b to partially expose the electrode terminals 24a, 24b of the semiconductor components 20a, 20b. Also, via holes 61B are formed in the insulation layer 61 to partially expose the second component shield portion 52. The via holes 61A, 61B may be formed, for example, through laser cutting using a $CO_2$ laser, a UV-YAG laser, or the like. If necessary, a desmear process is performed to remove residuals (resin smears). When the encapsulation resin 40 is formed from a photosensitive resin, the via holes 61A, 61B may be formed, for example, through photolithography.

Figure 5A:
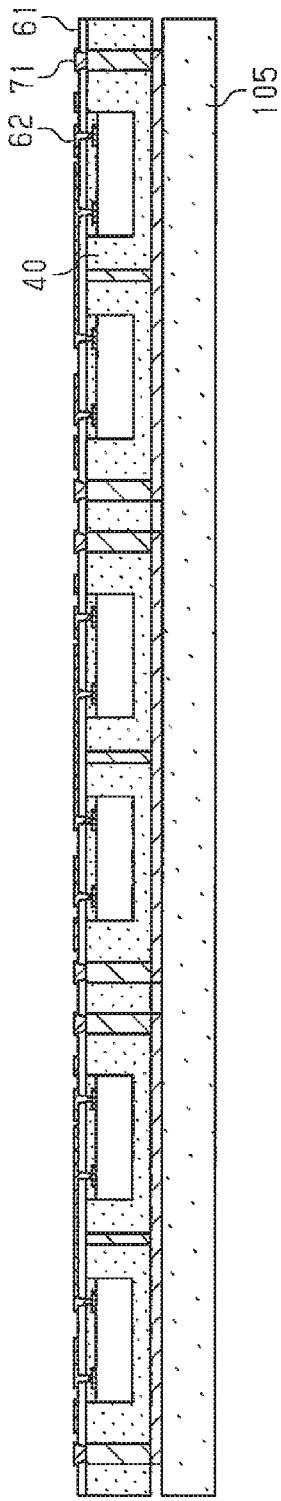

As illustrated in FIG. 5A, the wiring layer 62 and the first metal member 71 are formed. For example, a seed layer is formed on a surface of the insulation layer 61 through sputtering, and a resist film is formed on the upper surface of the seed layer. The resist film is patterned to form openings. Electrolytic plating (e.g., electrolytic copper plating) is performed using the seed layer as a plating power feeding layer. After the resist film is removed, the unnecessary seed layer is removed. This simultaneously forms the wiring layer 62 and the first metal member 71. In this case, the diameter of the openings formed in the resist film above the via holes 61B, which are illustrated in FIG. 4C, is set to be larger than the diameter of the via holes 61B. This allows the metal member 71 to include the flange 71a (refer to FIG. 1B).

Figure 5B:
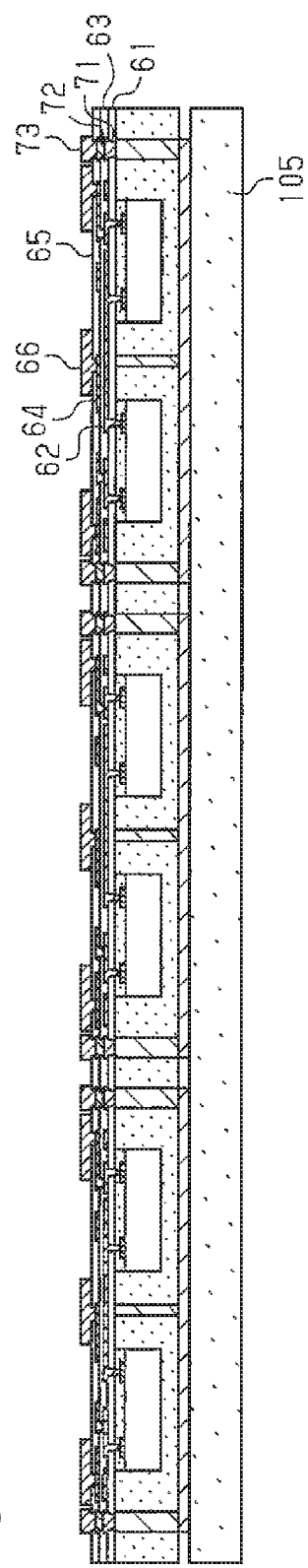

As illustrated in FIG. 5B, the insulation layer 63, the wiring layer 64, the insulation layer 65, and the wiring layer 66 are formed in the same manner as the insulation layer 61 and the wiring layer 62. Consequently, in the same manner as the first metal member 71, the second metal member 72 is formed simultaneously with the wiring layer 64, and the third metal member 73 is formed simultaneously with the wiring layer 66.

Figure 5C:
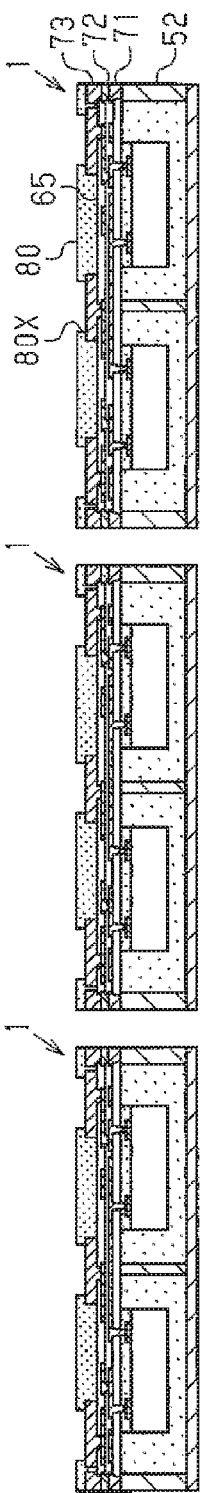

As illustrated in FIG. 5C, the solder resist layer 80 including the openings 80X is formed on the upper surface of the insulation layer 65. The solder resist layer 80 is obtained, for example, by laminating with a photosensitive solder resist film or applying a liquid solder resist and patterning the resist into a given shape through exposure and development of photolithography.

Then, the protective layer 105 illustrated in FIG. 5B is removed. The structure illustrated in FIG. 5B is cut and singulated into a number of the semiconductor devices 1 illustrated in FIG. 5C by a dicing blade or the like. The singulation, that is, the cutting step, allows the side surfaces of the second component shield portion 52 to be flush with the corresponding side surfaces of the first to third metal members 71 to 73.

Second Manufacturing Method

A second method for manufacturing the semiconductor device 1 will now be described. In the description, reference characters are given to elements as necessary. Reference characters may not be given to elements that are not described. For the sake of brevity, portions that ultimately become elements of the electronic device are indicated by reference characters used to denote the final elements.

As illustrated in FIG. 6A, the semiconductor components 20a, 20b are arranged on the upper surface of the flat support body 100 with the adhesive agent 30a and the adhesive agent 30b applied in between. The adhesive agent 30a and the adhesive agent 30b are applied to, for example, the lower surfaces 21a, 21b of the semiconductor components 20a, 20b, and the semiconductor components 20a, 20b are arranged on the upper surface of the support body 100. The semiconductor components 20a, 20b adhere to the upper surface of the support body 100 in a face-down state in which the lower surfaces 21a, 21b including the electrode terminals 24a, 24b are located at the lower side.

As illustrated in FIG. 6B, the encapsulation resin 40 is formed on the upper surface of the support body 100 to cover the semiconductor components 20a, 20b.

As illustrated in FIG. 7A, the openings 40A, 40B are formed in the encapsulation resin 40 to expose the upper surface of the support body 100. The openings 40A, 40B are formed in conformance with the shape of the component shield body 50 illustrated in FIGS. 1A to 1C. In the present example, the openings 40A are formed in the positions corresponding to the second component shield portion 52 of the component shield body 50. The openings 40B are formed in the positions corresponding to the third component shield portion 53.

The openings 40A, 40B may be formed through etching (e.g., dry etching) or laser cutting. In the case of etching, a resist film is formed to cover the encapsulation resin 40, and the resist film is patterned to form openings. The encapsulation resin 40 is etched from the openings to form the openings 40A, 40B. In the case of laser cutting, a $CO_2$ laser or a UV-YAG laser may be used. If necessary, a desmear process is performed to remove residuals (resin smears).

As illustrated in FIG. 7B, the component shield body 50 is formed. For example, a seed layer is formed on a surface of the encapsulation resin 40 through sputtering or electroless plating. The seed layer is covered by a resist film. The resist film is patterned to form openings. Subsequently, electrolytic plating (e.g., electrolytic copper plating) is performed using the seed layer exposed in the openings of the resist film as a plating power feeding layer. This forms a plating layer (metal layer) that is filled in the openings 40A, 40B and covers the upper surface of the encapsulation resin 40. The resist film is removed, and the unnecessary seed layer is removed, for example, through etching. This forms the component shield body 50. The above process allows for the simultaneous formation of the first to third component shield portions 51 to 53.

Alternatively, the component shield body 50 may be formed using a paste filling process. For example, in FIG. 7A, a resist film including openings, which are arranged in given positions, is formed on the upper surface of the encapsulation resin 40. The openings are formed in the positions corresponding to the component shield body 50 (refer to FIGS. 1A to 1C). The openings are filled with a conductive paste, and the conductive paste is cured. This forms the component shield body 50 illustrated in FIG. 7B. For example, a copper paste or an alloy paste containing copper is used as the conductive paste.

The subsequent steps are the same as the steps of the first manufacturing method illustrated in FIGS. 4B to 5C and will not be described. The second manufacturing method obtains the semiconductor device 1 illustrated in FIG. 1B in the same manner as the first manufacturing method.

The present embodiment has the advantages described below.

(1) In the semiconductor device 1, the component shield body 50 covers the upper surface 41 and the side surfaces 42 of the encapsulation resin 40, which covers the semiconductor components 20a, 20b. The wiring structural body 60 of the semiconductor device 1 includes the wiring layers 62, 64, 66 and the insulation layers 61, 63, 65. The wiring layers 62, 64, 66 are connected to the semiconductor components 20a, 20b. The insulation layers 61, 63, 65 of the wiring structural body 60 are covered by the frame-shaped wiring shield body 70. The wiring shield body 70 is connected to the component shield body 50.

The wiring shield body 70 includes the side surfaces 70a, which are exposed to the exterior. The side surfaces 70a are coplanar with the corresponding side surfaces 52a of the component shield body 50. That is, the side surfaces 70a, 52a are flush with each other. This reduces the size of the semiconductor device 1 as compared to a conventional semiconductor device including a shield case. Additionally, the first component shield portion 51 of the component shield body 50 is in contact with the upper surface 41 of the encapsulation resin 40 to cover the encapsulation resin 40. The encapsulation resin 40 only needs to cover the electronic components including the semiconductor components 20a, 20b in the semiconductor device 1. This reduces the thickness of the semiconductor device 1.

(2) The component shield body 50 and the wiring shield body 70 cover the upper surface and side surfaces of the semiconductor device 1. More specifically, the semiconductor device 1 includes the shields (component shield body 50 and wiring shield body 70) that cover the semiconductor components 20a, 20b and the wiring layers 62, 64, 66 to shield out electromagnetic waves. The shields shield the semiconductor components 20a, 20b and the wiring layers 62, 64, 66 from electromagnetic waves that are present outside the semiconductor device 1. Thus, the shields limit effects of electromagnetic waves on the semiconductor components 20a, 20b and the wiring layers 62, 64, 66. The shields also limit emission of electromagnetic waves from the semiconductor device 1 to the exterior.

(3) The component shield body 50 includes the third component shield portion 53. The third component shield portion 53 is located between the semiconductor component 20a and the semiconductor component 20b. Thus, the third component shield portion 53 limits effects of electromagnetic waves between the semiconductor component 20a and the semiconductor component 20b.

(4) The inner walls of the wiring shield body 70 have irregularities. The irregularities limit separation of the wiring shield body 70 from the wiring structural body 60.

It should be apparent to those skilled in the art that the foregoing embodiments may be employed in many other specific forms without departing from the scope of this disclosure. Particularly, it should be understood that the foregoing embodiments may be employed in the following forms.

The same reference characters are given to elements of the following modified examples that are the same as the corresponding elements of the above embodiment. Such elements will not be partially or entirely described.

First Modified Example

Figures 8A, 8C:
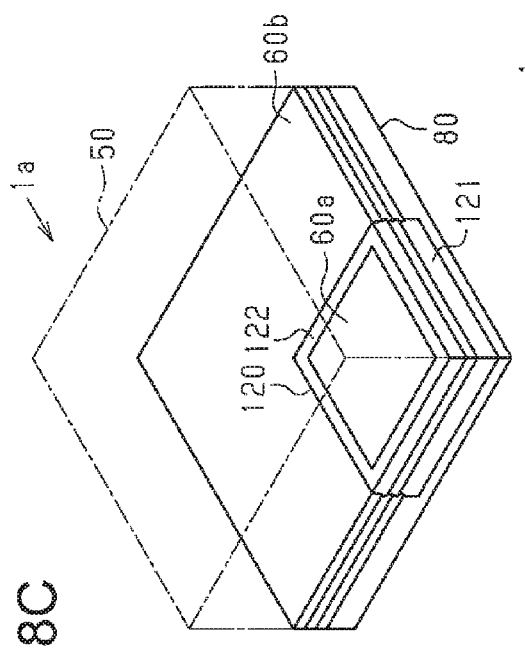
FIG. 8A is a schematic perspective view illustrating a first modified example of a semiconductor device.
FIG. 8C is a schematic perspective view of a wiring structural body illustrated in FIG. 8B.
Figure 8B:
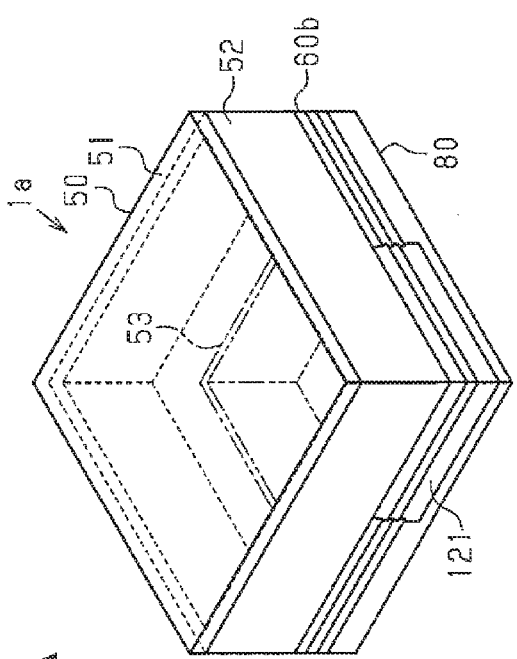
FIG. 8B is a schematic cross-sectional view of the semiconductor device illustrated in FIG. 8A.

FIG. 8B illustrates a semiconductor device 1a that includes the semiconductor components 20a, 20b, the encapsulation resin 40, the component shield body 50, wiring structural bodies 60a, 60b, a wiring shield body 120, and the solder resist layer 80.

The wiring structural body 60a includes insulation layers 141, 143, 145 and wiring layers 142, 144, 146. The wiring layers 142, 144, 146 are connected to the semiconductor component 20a. The wiring structural body 60b includes insulation layers 151, 153, 155 and wiring layers 152, 154, 156. The wiring layers 152, 154, 156 are connected to the semiconductor component 20b. In a first modified example, as illustrated in FIG. 8C, the wiring shield body 120 is frame-shaped to surround the wiring structural body 60a. Thus, the wiring shield body 120 electromagnetically separates the wiring layers 142, 144, 146 that are included in the wiring structural body 60a and connected to the semiconductor component 20a from the wiring layers 152, 154, 156 that are included in the wiring structural body 60b and connected to the semiconductor component 20b.

The wiring shield body 120 includes a first wiring shield portion 121, which is exposed at side surfaces of the semiconductor device 1a, and a second wiring shield portion 122, which is located between the wiring structural body 60a and the wiring structural body 60b. Thus, as illustrated in FIG. 8A, the wiring structural body 60b is exposed at side surfaces of the semiconductor device 1a.

As illustrated in FIG. 8B, the first wiring shield portion 121 is connected to the second component shield portion 52 of the component shield body 50. The second wiring shield portion 122 is connected to the third component shield portion 53 of the component shield body 50.

As illustrated in FIG. 8C, the wiring shield body 120 is frame-shaped by the first wiring shield portion 121 and the second wiring shield portion 122. The wiring shield body 120 is formed to surround the wiring structural body 60a, that is, partially surround the wiring structural bodies of the semiconductor device 1a. The third component shield portion 53 indicated by the double-dashed lines in FIG. 8A partially separates the interior of the component shield body 50 indicated by the single-dashed lines in FIG. 8C.

In the semiconductor device 1a, the component shield body 50 electromagnetically separates the semiconductor components 20a, 20b from the exterior of the semiconductor device 1a. Thus, the component shield body 50 limits effects of electromagnetic waves from outside the semiconductor device 1a on the semiconductor components 20a, 20b. The component shield body 50 also limits emission of electromagnetic waves from the semiconductor components 20a, 20b to the exterior of the semiconductor device 1a.

Additionally, the third component shield portion 53 of the component shield body 50 electromagnetically separates the semiconductor component 20a from the semiconductor component 20b. The wiring shield body 120 electromagnetically separates the wiring structural body 60a from the wiring structural body 60b, that is, the wiring layers 142, 144, 146 connected to the semiconductor component 20a from the wiring layers 152, 154, 156 connected to the semiconductor component 20b. Thus, in the semiconductor device 1a, the wiring shield body 120 limits effects of electromagnetic waves on the semiconductor component 20b and the wiring layers 152, 154, 156 from other components (e.g., semiconductor component 20a and wiring structural body 60). The wiring shield body 120 also limits emission of electromagnetic waves from the semiconductor component 20b and the wiring layers 152, 154, 156 to other components (e.g., semiconductor component 20a and wiring structural body 60).

The first wiring shield portion 121 exposed to the exterior of the semiconductor device 1a includes first, second, and third metal members 161, 162, 163 in the same manner as the wiring shield body 70 of the above embodiment. The second wiring shield portion 122 located between the wiring structural body 60a and the wiring structural body 60b also includes first, second, and third metal members 171, 172, 173. Further, in the same manner as the wiring shield body 70 of the above embodiment, the first to third metal members 161, 162, 163 of the first wiring shield portion 121 respectively include flanges 161a, 162a, 163a, which respectively extend on the lower surfaces of the insulation layers 141, 143, 145 to form irregular walls, which are in contact with the wiring structural body 60a. The irregular walls of the first wiring shield portion 121 prevent separation of the wiring structural body 60a from the first wiring shield portion 121. Also, in the second wiring shield portion 122, the first to third metal members 171, 172, 173 respectively include flanges 171a, 172a, 173a, which respectively extend on the lower surfaces of the insulation layers 141, 143, 145 to form first irregular walls, which are in contact with the wiring structural body 60a. Further, the flanges 171a, 172a, 173a respectively extend on the lower surfaces of the insulation layers 151, 153, 155 to form second irregular walls, which are in contact with the wiring structural body 60b. The first irregular walls of the second wiring shield portion 122 prevent separation of the wiring structural body 60a from the second wiring shield portion 122. The second irregular walls of the second wiring shield portion 122 prevent separation of the wiring structural body 60b from the second wiring shield portion 122.

Second Modified Example

Figure 9:
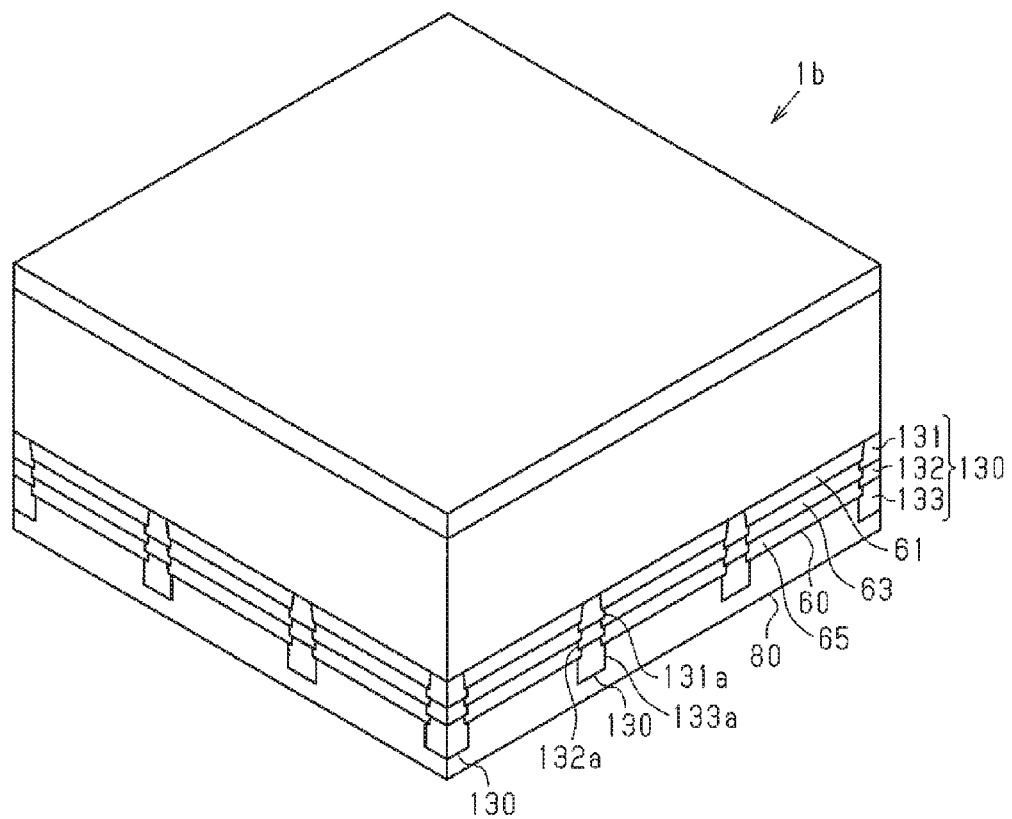
FIG. 9 is a schematic perspective view illustrating a second modified example of a semiconductor device.

FIG. 9 illustrates a semiconductor device 1b that includes a plurality of post-shaped wiring shield bodies 130. In a second modified example, the wiring structural body 60 is partially exposed at side surfaces of the semiconductor device 1b.

In the same manner as the wiring shield body 70 of the above embodiment, each of the wiring shield bodies 130 includes first, second, and third metal members 131, 132, 133. Further, in the same manner as the wiring shield body 70 of the above embodiment, the first to third metal members 131, 132, 133 respectively include flanges 131a, 132a, 133a, which respectively extend on the lower surfaces of the insulation layers 61, 63, 65 to form irregular walls. The irregular walls of the wiring shield bodies 130 prevent separation of the wiring structural body 60 from the wiring shield bodies 130. The wiring shield bodies 130 produce the same effect as a mesh shield member. The wiring shield bodies 130 limit electromagnetic waves having a particular frequency in accordance with intervals of the wiring shield bodies 130. In the same manner as the above embodiment, the semiconductor device 1b limits effects of electromagnetic waves on semiconductor components and wiring layers included in the semiconductor device 1b.

Third Modified Example

Figure 10:
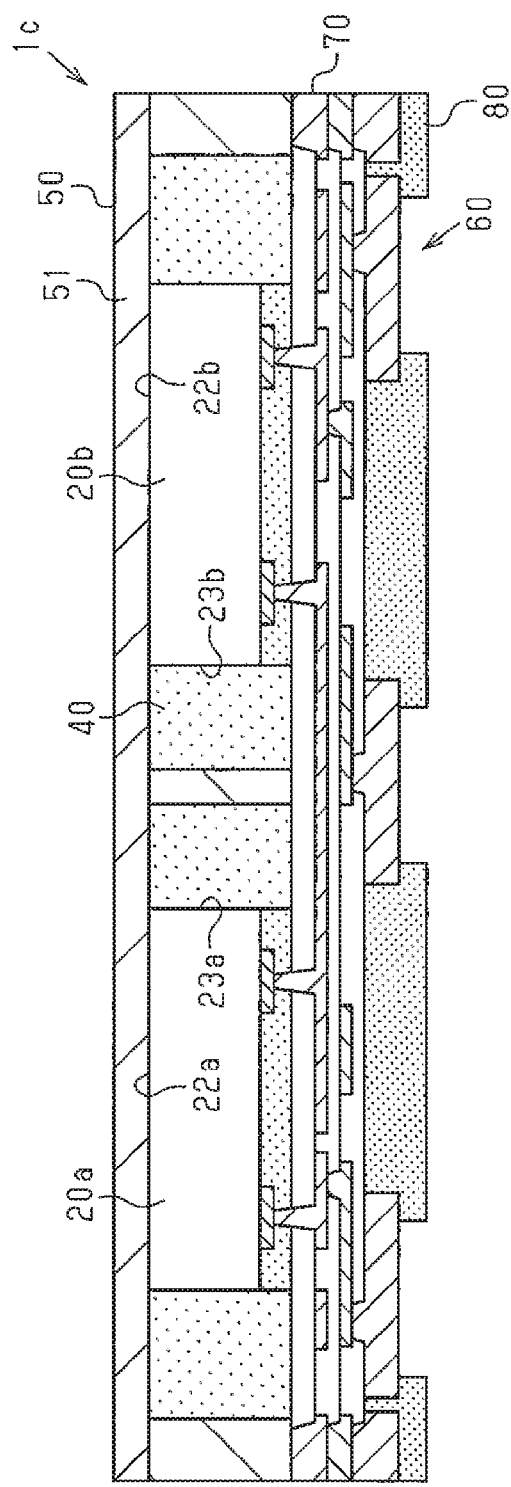
FIG. 10 is a schematic cross-sectional view illustrating a third modified example of a semiconductor device.

FIG. 10 illustrates a semiconductor device 1c that includes the semiconductor components 20a, 20b, the encapsulation resin 40, the component shield body 50, the wiring structural body 60, the wiring shield body 70, and the solder resist layer 80. In a third modified example, the encapsulation resin 40 covers the side surfaces 23a, 23b of the semiconductor components 20a, 20b. The upper surfaces 22a, 22b of the semiconductor components 20a, 20b are connected to the first component shield portion 51 of the component shield body 50. In the semiconductor device 1c, heat is directly transmitted from the semiconductor components 20a, 20b to the component shield body 50 and discharged out of the semiconductor device 1c. Thus, the component shield body 50 functions as a heat dissipation body that dissipates heat of the semiconductor components 20a, 20b.

The above embodiments and modified examples may further be employed in the following forms.

The third component shield portion 53 (refer to FIG. 1B) may be omitted from the above embodiment. Further, the above embodiment may include a plurality of third component shield portions 53.

In the first modified example (refer to FIG. 8A), the region defined by the third component shield portion 53 may be changed.

The above embodiments and modified examples may be combined. For example, in the semiconductor device 1b illustrated in FIG. 9, the second metal member 132 may be frame-shaped to surround the insulation layers in the same manner as the second metal member 72 of the embodiment illustrated in FIG. 1B.

The wiring shield body 70 of the above embodiment, which surrounds the wiring structural body 60, may be combined with the second wiring shield portion 122 of the first modified example, which partially surrounds the insulation layers.

Clauses

This disclosure further encompasses the following embodiments.

1. A method for manufacturing a semiconductor device, the method including:
  arranging an electronic component on a support body so that a surface of the electronic component on which an electrode terminal is formed faces the support body;
  forming an encapsulation resin that covers the electronic component;
  forming a component shield body that covers the encapsulation resin;
  removing the support body; and
  forming a wiring structural body, which includes an insulation layer and a wiring layer that is connected to the electronic component, and a wiring shield body, which is arranged on a side surface of the wiring structural body and connected to the component shield body, on a surface of the encapsulation resin from which the support body has been removed.

2. A method for manufacturing a semiconductor device, the method including:
  forming a plurality of upright shield portions on an upper surface of a support body;
  arranging an electronic component on the upper surface of the support body located between the shield portions so that a surface of the electrode component on which an electrode terminal is formed faces the support body;
  forming an encapsulation resin that covers the electronic component;
  forming a metal layer on the upper surface of the encapsulation resin, wherein the metal layer continuously covers an upper surface side of the electronic component and is connected to the shield portions to form a component shield body that includes the shield portions and the metal layer;
  removing the support body; and
  forming a wiring structural body, which includes an insulation layer and a wiring layer that is connected to the electronic component, and a wiring shield body, which is arranged on a side surface of the wiring structural body and connected to the component shield body, on a surface of the encapsulation resin from which the support body has been removed.

3. The method according to clause 1 or 2, wherein
the wiring structural body is formed by alternately stacking a plurality of insulation layers and a plurality of wiring layers, and
the wiring shield body includes a plurality of metal members formed simultaneously with the wiring layers.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device comprising:
  an electronic component including a lower surface on which an electrode terminal is arranged;
  a wiring structural body located below the electronic component, wherein the wiring structural body includes an insulation layer and a wiring layer that is connected to the electrode terminal;
  a wiring shield body arranged on a lateral side surface of the wiring structural body;
  an encapsulation resin that covers an upper surface of the wiring structural body and a lateral side surface of the electronic component; and
  a component shield body that covers a surface of the encapsulation resin and continuously covers an upper surface side of the electronic component, wherein
  the wiring shield body is connected to the component shield body,
  the wiring shield body is an electromagnetic shield,
  the wiring shield body comprises a plurality of wall shield portions, each of which extends through the wiring structural body in a stacking direction,
  the plurality of wall shield portions are connected to be frame-shaped,
  each of the plurality of wall shield portions includes a first wall shield layer extending through the insulation layer and a second wall shield layer located in a same layer as the wiring layer,
  at least one of the plurality of wall shield portions is arranged so that both of a lateral side surface of the first wall shield layer and a lateral side surface of the second wall shield layer are exposed to an exterior from the wiring structural body, and
  the lateral side surface of the first wall shield layer and the lateral side surface of the second wall shield layer that are exposed from the wiring shield body are coplanar with a lateral side surface of the component shield body.

2. The semiconductor device according to claim 1, wherein the first wall shield layer and the second wall shield layer form an irregular wall that is in contact with the wiring structural body.

3. The semiconductor device according to claim 2, wherein
the wiring structural body includes a plurality of insulation layers, and
each of the first wall shield layer and the second wall shield layer includes a flange that extends a lower surface of one of the plurality of insulation layers to form the irregular wall of the wiring shield body.

4. The semiconductor device according to claim 1, wherein
the component shield body includes
a first shield portion that covers an upper surface of the encapsulation resin, and
a second shield portion that is connected to the first shield portion and covers a lateral side surface of the encapsulation resin,
at least one of the plurality of wall shield portions is connected to the second shield portion, and
the plurality of wall shield portions are connected to be frame-shaped to surround the lateral side surface of the wiring structural body.

5. The semiconductor device according to claim 1, wherein
the electronic component is one of a plurality of electronic components covered by the encapsulation resin,
the component shield body includes
a first shield portion that covers an upper surface of the encapsulation resin,
a second shield portion that is connected to the first shield portion and covers a lateral side surface of the encapsulation resin, and
a third shield portion that electromagnetically separates one or more of the plurality of electronic components from remaining ones of the plurality of electronic components,
the plurality of wall shield portions include
a first wall shield portion partially connected to the second shield portion, and
a second wall shield portion connected to the third shield portion, and the first wall shield portion and the second wall shield portion are connected to be frame-shaped.

6. The semiconductor device according to claim 1, further comprising:
a protective insulation layer arranged on a surface of the wiring structural body opposite to the electronic component, wherein
the protective insulation layer covers a lower surface of the insulation layer and a lower surface of the wiring shield body, and
the protective insulation layer includes an opening that partially exposes a lower surface of the wiring layer as an external connection terminal.

7. A semiconductor device comprising:
an electronic component including a lower surface on which an electrode terminal is arranged;
a wiring structural body located below the electronic component, wherein the wiring structural body includes an insulation layer and a wiring layer that is connected to the electrode terminal;
a wiring shield body arranged on a lateral side surface of the wiring structural body;
an encapsulation resin that covers an upper surface of the wiring structural body and a lateral side surface of the electronic component; and
a component shield body that covers a surface of the encapsulation resin and continuously covers an upper surface side of the electronic component, wherein
the wiring shield body is connected to the component shield body,
the wiring shield body is an electromagnetic shield,
the wiring shield body comprises a plurality of post-shaped shield portions, each of which extends through the wiring structural body in a stacking direction,
the plurality of post-shaped shield portions are arranged to be frame-shaped,
each of the plurality of post-shaped shield portions includes a via-shaped shield layer extending through the insulation layer and a base shield layer located in a same layer as the wiring layer,
at least one of the plurality of post-shaped shield portions is arranged so that both of a lateral side surface of the via-shaped shield layer and a lateral side surface of the base shield layer are exposed to an exterior from the wiring structural body, and
the lateral side surface of the via-shaped shield layer and the lateral side surface of the base shield layer that are exposed from the wiring shield body are coplanar with a lateral side surface of the component shield body.

8. The semiconductor device according to claim 7, wherein the via-shaped shield layer and the base shield layer form an irregular wall that is in contact with the wiring structural body.

9. The semiconductor device according to claim 8, wherein
the wiring structural body includes a plurality of insulation layers, and
each of the via-shaped shield layer and the base shield layer includes a flange that extends a lower surface of one of the plurality of insulation layers to form the irregular wall of the wiring shield body.

10. The semiconductor device according to claim 7, wherein
the component shield body includes
a first shield portion that covers an upper surface of the encapsulation resin, and
a second shield portion that is connected to the first shield portion and covers a lateral side surface of the encapsulation resin,
the plurality of post-shaped shield portions are connected to the second shield portion, and
the plurality of post-shaped shield portions are exposed from the lateral side surface of the wiring structural body.

11. The semiconductor device according to claim 7, further comprising:
a protective insulation layer arranged on a surface of the wiring structural body opposite to the electronic component, wherein
the protective insulation layer covers a lower surface of the insulation layer and a lower surface of the wiring shield body, and
the protective insulation layer includes an opening that partially exposes a lower surface of the wiring layer as an external connection terminal.

* * * * *